United States Patent
Yano et al.

(10) Patent No.: US 12,199,005 B2
(45) Date of Patent: Jan. 14, 2025

(54) SILICON NITRIDE CIRCUIT BOARD AND ELECTRONIC COMPONENT MODULE

(71) Applicant: DENKA COMPANY LIMITED, Tokyo (JP)

(72) Inventors: Seiji Yano, Tokyo (JP); Katsunori Terano, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 255 days.

(21) Appl. No.: 17/598,968

(22) PCT Filed: Mar. 26, 2020

(86) PCT No.: PCT/JP2020/013619
§ 371 (c)(1),
(2) Date: Sep. 28, 2021

(87) PCT Pub. No.: WO2020/203633
PCT Pub. Date: Oct. 8, 2020

(65) Prior Publication Data
US 2022/0216125 A1   Jul. 7, 2022

(30) Foreign Application Priority Data

Mar. 29, 2019   (JP) ................. 2019-066151

(51) Int. Cl.
*H01L 23/373*   (2006.01)
*H01L 23/498*   (2006.01)
*H01L 23/00*    (2006.01)

(52) U.S. Cl.
CPC .... *H01L 23/3735* (2013.01); *H01L 23/49866* (2013.01); *H01L 24/29* (2013.01);
(Continued)

(58) Field of Classification Search
None
See application file for complete search history.

(56) References Cited

U.S. PATENT DOCUMENTS 6,569,514 B2 *   5/2003   Naba ............ H05K 3/381
                                                 428/210
6,613,443 B2     9/2003   Komatsu et al.
(Continued)

FOREIGN PATENT DOCUMENTS

EP   1 921 675 A1   5/2008
EP   2579696 A1    4/2013
(Continued)

OTHER PUBLICATIONS

Apr. 28, 2022 Extended Search Report issued in European Patent Application No. 20783986.1.
(Continued)

*Primary Examiner* — Nishath Yasmeen
(74) *Attorney, Agent, or Firm* — Oliff PLC

(57) ABSTRACT

A silicon nitride circuit board includes a silicon nitride substrate, a first copper layer over one surface of the silicon nitride substrate, and a second copper layer over the other surface of the silicon nitride substrate, in which a fracture toughness value Kc of the silicon nitride substrate is equal to or more than 5.0 MPa·m$^{0.5}$ and equal to or less than 10.0 MPa·m$^{0.5}$, and when a coefficient of linear expansion of the silicon nitride substrate is $\alpha_B$ (/° C.), a Young's modulus of the silicon nitride substrate is $E_B$ (GPa), a coefficient of linear expansion of the first copper layer is $\alpha_A$ (/° C.), and a coefficient of linear expansion of the second copper layer is $\alpha_C$ (/° C.), each of a heat shock parameter HS1 and a heat shock parameter HS2 is equal to or more than 1.30 GPa and equal to or less than 2.30 GPa.

12 Claims, 4 Drawing Sheets

(52) U.S. Cl.
CPC .............. *H01L 2224/29109* (2013.01); *H01L 2224/29111* (2013.01); *H01L 2224/2912* (2013.01); *H01L 2224/29139* (2013.01); *H01L 2224/29147* (2013.01); *H01L 2224/32225* (2013.01); *H01L 2924/1203* (2013.01); *H01L 2924/13055* (2013.01); *H01L 2924/13091* (2013.01)

(56) References Cited

U.S. PATENT DOCUMENTS

| | | | |
|---|---|---|---|
| 10,170,433 B2 * | 1/2019 | Soda | ..................... H01L 23/562 |
| 11,046,617 B2 | 6/2021 | Kim et al. | |
| 2002/0084103 A1 | 7/2002 | Komatsu et al. | |
| 2009/0101392 A1 | 4/2009 | Kaga et al. | |
| 2011/0176277 A1 * | 7/2011 | Kaga | ..................... H05K 1/0306 |
| | | | 264/650 |
| 2011/0272187 A1 * | 11/2011 | Kaga | ....................... H01L 23/15 |
| | | | 174/255 |
| 2017/0338189 A1 | 11/2017 | Soda et al. | |
| 2018/0190568 A1 * | 7/2018 | Naba | ..................... C04B 37/026 |
| 2020/0165167 A1 | 5/2020 | Kim et al. | |

FOREIGN PATENT DOCUMENTS

| | | | |
|---|---|---|---|
| JP | 2002-201075 A | | 7/2002 |
| JP | 2006-128286 | * | 5/2006 |
| JP | 2006128286 A | * | 5/2006 |
| JP | 2007-299973 | * | 11/2007 |
| JP | 2007299973 A | * | 11/2007 |
| WO | 2011/149065 A1 | | 12/2011 |
| WO | 2019/059641 A2 | | 3/2019 |

OTHER PUBLICATIONS

Mar. 12, 2024 Office Action issued in European Patent Application No. 20 783 986.1.
Jun. 16, 2020 International Search Report issued in International Patent Application No. PCT/JP2020/013619.
Nov. 1, 2024 Office Action issued in Chinese Patent Application No. 202080025366.8.

* cited by examiner

SILICON NITRIDE CIRCUIT BOARD AND ELECTRONIC COMPONENT MODULE

TECHNICAL FIELD

The present invention relates to a silicon nitride circuit board and an electronic component module.

BACKGROUND ART

As a circuit board used for a power module or the like, from the viewpoint of thermal conductivity, cost, safety, and the like, ceramic substrates of alumina, beryllia, silicon nitride, and aluminum nitride are used. These ceramic substrates are used as the circuit board by being bonded to a metal circuit layer such as copper or aluminum or a heat dissipation layer. These substrates have excellent insulation property and heat dissipation property with respect to a resin substrate and a metal substrate of which an insulating material is a resin layer, and thus the substrates are used as the substrate on which an electronic component having high heat dissipation property is mounted.

For power module applications such as elevators, vehicles, and hybrid cars, a ceramic circuit board is used in which a metal circuit board is bonded to a surface of a ceramic substrate with a brazing material, and a semiconductor element is mounted at a predetermined position on the metal circuit board. In recent years, the ceramic substrate such as an aluminum nitride sintered body or a silicon nitride sintered body, which have high thermal conductivity in response to an increase in an amount of heat generated from the semiconductor element due to high integration, high frequency, and high output of the semiconductor element is used. Above all, in particular, the high mechanical reliability is required as the ceramic substrate on which the electronic component is mounted, a silicon nitride substrate having excellent mechanical strength and toughness is attracting attention.

Further, in an electronic component module and the like, since the thermal stress is repeatedly applied to the ceramic circuit board, there is a problem that minute cracks may be generated on the ceramic substrate in a case in which the ceramic substrate cannot withstand the thermal stress or a metal circuit layer may be peeled off from the ceramic substrate in a case in which a thermal load cycle continues to be applied with these minute cracks generated, and thus poor bonding strength or poor thermal resistance is caused and the operational reliability as the electronic device is lowered.

Therefore, for example, Patent Document 1 discloses a technique for setting a fracture toughness value of the silicon nitride substrate to be equal to or more than 6.5 MPa·m$^{1/2}$. According to the invention disclosed in Patent Document 1, by using the silicon nitride substrate having a three-point bending strength equal to or more than 500 MPa and the fracture toughness value equal to or more than 6.5 MPa·m$^{1/2}$, generation of cracks due to the thermal stress can be suppressed.

RELATED DOCUMENT

Patent Document

[Patent Document 1] Japanese Unexamined Patent Publication No. 2002-201075

However, in the electronic component module and the like, high output and high integration progress, and the thermal stress repeatedly applied to the ceramic circuit board tends to increase, in the related art, there is a case in which the ceramic substrate cannot withstand the thermal stress, for example, minute cracks are generated or the metal circuit layer is peeled off from the ceramic substrate, so that poor bonding strength or poor thermal resistance is caused, and thus the reliability of the electronic component module in which the electronic component such as the semiconductor element is mounted on the ceramic circuit board is not sufficient.

SUMMARY OF THE INVENTION

Technical Problem

In view of the above problems, the present invention is to obtain a silicon nitride circuit board capable of improving reliability and yield as an electronic component module.

Solution to Problem

According to the present invention, a silicon nitride circuit board and an electronic component module are provided as follows.

That is, the present invention provides a silicon nitride circuit board including a silicon nitride substrate, a first copper layer provided over one surface of the silicon nitride substrate, and a second copper layer provided over the other surface of the silicon nitride substrate, in which a fracture toughness value Kc of the silicon nitride substrate is equal to or more than 5.0 MPa·m$^{0.5}$ and equal to or less than 10.0 MPa·m$^{0.5}$, and in a case in which a coefficient of linear expansion of the silicon nitride substrate is defined as $\alpha_B$ (/° C.), a Young's modulus of the silicon nitride substrate is defined as $E_B$ (GPa), a coefficient of linear expansion of the first copper layer is $\alpha_A$ (/° C.), and a coefficient of linear expansion of the second copper layer is defined as $\alpha_C$ (/° C.), each of a heat shock parameter HS1 represented by Equation (1) and a heat shock parameter HS2 represented by Equation (2) is equal to or more than 1.30 GPa and equal to or less than 2.30 GPa.

$$HS1=(\alpha_A-\alpha_B)\times E_B\times(350-(-78)) \qquad \text{Equation (1)}$$

$$HS2=(\alpha_C-\alpha_B)\times E_B\times(350-(-78)) \qquad \text{Equation (2)}$$

The present invention provides an electronic component module including a silicon nitride circuit board, an electronic component mounted over the silicon nitride circuit board, and a sealing resin portion that seals the silicon nitride circuit board and the electronic component, in which the silicon nitride circuit board is the silicon nitride circuit board described above.

Advantageous Effects of Invention

Since the silicon nitride circuit board according to the present invention is configured as described above, it is possible to obtain the electronic component module having low occurrence rate of poor bonding strength or poor thermal resistance in a case in which the thermal stress is applied and high reliability and yield as an electronic device.

DESCRIPTION OF EMBODIMENTS

Figure 1:
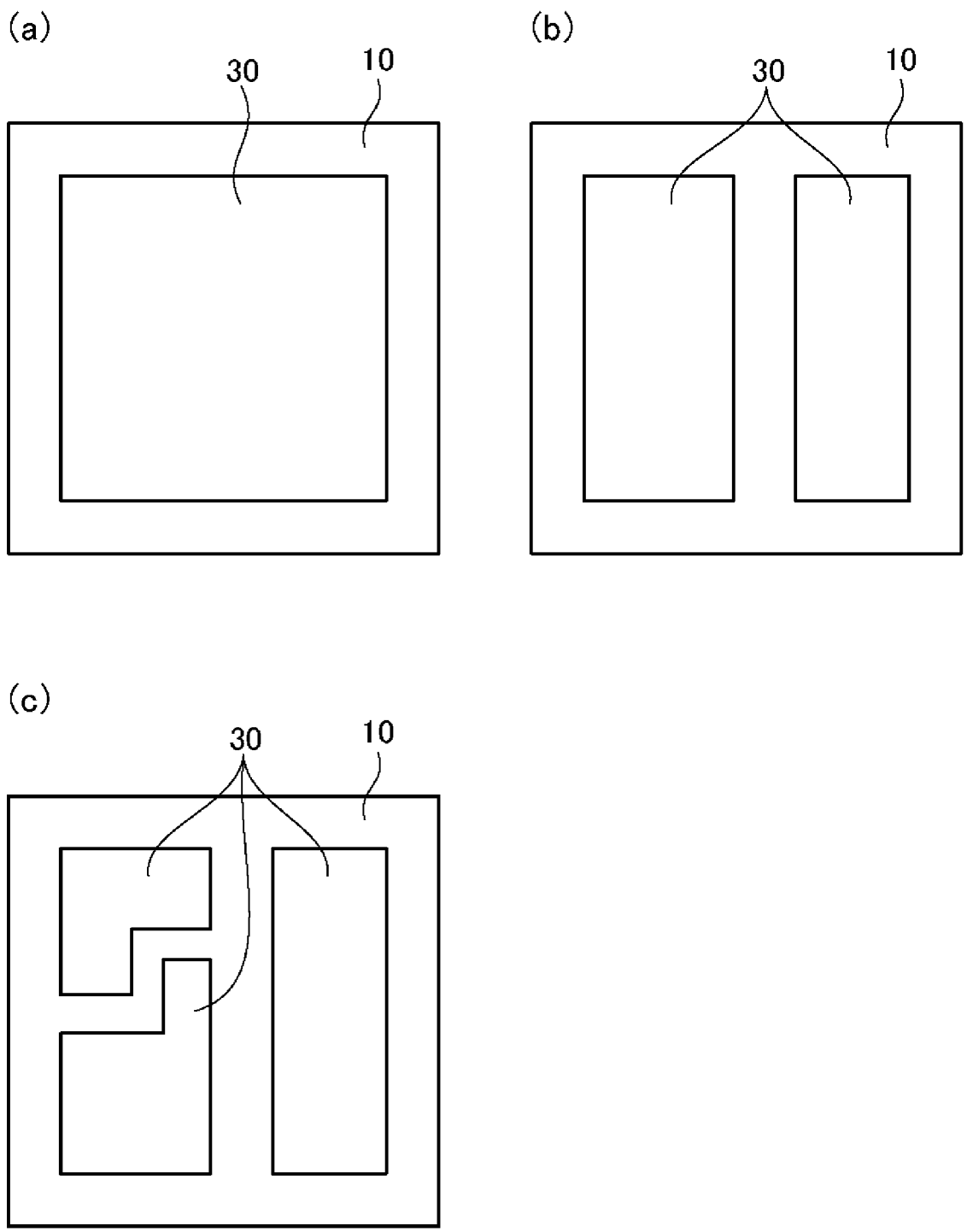
FIG. 1 is a plan view of a silicon nitride circuit board according to the present embodiment.

Embodiments of the present invention will be described below with reference to the drawings. In all drawings, similar components are designated by the same reference numerals, and description thereof will not be repeated. Further, the drawings are schematic views and do not match the actual dimensional ratio.

First, a configuration of a silicon nitride substrate according to the present embodiment will be described.

Configuration of Silicon Nitride Circuit Board According to Present Embodiment

The silicon nitride circuit board according to the present embodiment will be described with reference to FIGS. 1 to 2. FIG. 1 is a plan view of the silicon nitride circuit board according to the present embodiment, and FIG. 2 is a cross-sectional view of the silicon nitride circuit board according to the present embodiment.

Figure 2:
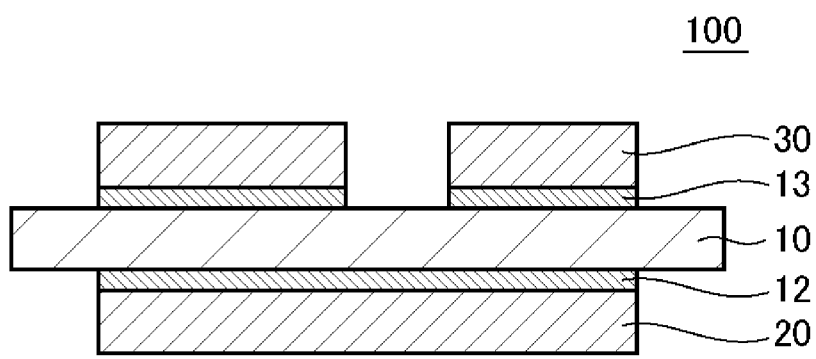
FIG. 2 is a cross-sectional view of the silicon nitride circuit board according to the present embodiment.

As shown in FIG. 2, a silicon nitride circuit board 100 according to the present embodiment includes a silicon nitride substrate 10, a first copper layer 30, and a second copper layer 20. Further, the silicon nitride substrate 10 and the second copper layer 20 has a laminated state with a brazing material layer 12 interposed therebetween, and the silicon nitride substrate 10 and the first copper layer 30 has a laminated state with a brazing material layer 13 interposed therebetween.

In the present embodiment, a "silicon nitride-copper composite" refers to a state in which the first copper layer 30, the brazing material layer 13, the silicon nitride substrate 10, the brazing material layer 12, and the second copper layer 20 are laminated, and is a state before a circuit pattern is formed. Further, the "silicon nitride circuit board" means a state in which the circuit pattern is formed on the "silicon nitride-copper composite", and may be a state in which an electronic component such as an electronic component 40 is mounted over a part of the copper layer on which the circuit pattern is formed.

The silicon nitride circuit board according to the present embodiment includes, as described above, the silicon nitride substrate 10, the first copper layer 30 provided over one surface of the silicon nitride substrate 10, and the second copper layer 20 provided over the other surface of the silicon nitride substrate, in which a fracture toughness value Kc of the silicon nitride substrate 10 is equal to or more than 5.0 MPa·m$^{0.5}$ and equal to or less than 10.0 MPa·m$^{0.5}$, and in a case in which a coefficient of linear expansion of the silicon nitride substrate 10 is defined as $\alpha_B$ (/° C.), a Young's modulus of the silicon nitride substrate 10 is defined as $E_B$ (GPa), a coefficient of linear expansion of the first copper layer 30 is $\alpha_A$ (/° C.), and a coefficient of linear expansion of the second copper layer 20 is defined as $\alpha_C$ (/° C.), each of a heat shock parameter HS1 represented by Equation (1) and a heat shock parameter HS2 represented by Equation (2) is set to be equal to or more than 1.30 GPa and equal to or less than 2.30 GPa.

$$HS1=(\alpha_A-\alpha_B)\times E_B\times(350-(-78)) \quad \text{Equation (1)}$$

$$HS2=(\alpha_C-\alpha_B)\times E_B\times(350-(-78)) \quad \text{Equation (2)}$$

In the above equations, HS1 and HS2 are the products of a difference between the coefficients of linear expansion of the silicon nitride substrate 10 and the second copper layer 20 which are laminated and between the coefficients of linear expansion of the silicon nitride substrate 10 and the first copper layer 30, the Young's modulus of the silicon nitride substrate 10, and the temperature, and are the parameters related to the thermal stress that can be accumulated between the silicon nitride substrate 10 and the second copper layer 20 and between the silicon nitride substrate 10 and the first copper layer 30.

For example, a silicon nitride substrate having the coefficient of linear expansion $\alpha_B=4.0\times10^{-6}$ (/° C.) and the Young's modulus $E_B=250$ (GPa) is used as the silicon nitride substrate 10, and in a case in which the coefficient of linear expansion of the first copper layer 30 is defined as $\alpha_A=17.3\times10^{-6}$ (/° C.) and the coefficient of linear expansion of the second copper layer 20 is defined as $\alpha_C=17.3\times10^{-6}$ (/° C.), it is satisfied that $HS1=(\alpha_A-\alpha_B)\times E_B\times(350-(-78))=1.42$ (GPa) and $HS2=(\alpha_C-\alpha_B)\times E_B\times(350-(-78))=1.42$ (GPa).

The fracture toughness value Kc of the silicon nitride substrate 10 is more preferably equal to or more than 5.5 MPa·m$^{0.5}$ and equal to or less than 9.0 MPa·m$^{0.5}$. Further, the heat shock parameter HS1 represented by Equation (1) and the heat shock parameter HS2 represented by Equation (2) are more preferably equal to or more than 1.30 GPa and equal to or less than 1.80 GPa.

The heat shock parameter HS1 represented by Equation (1), the heat shock parameter HS2 represented by Equation (2), and the fracture toughness value Kc of the silicon nitride substrate 10 can be adjusted by controlling the type of the constituent materials used for manufacturing the silicon nitride circuit board, the manufacturing conditions, and the like.

According to the present embodiment, the heat shock parameters HS1 and HS2, and the fracture toughness value Kc of the silicon nitride substrate 10 are set within the above numerical ranges, and a residual stress accumulated in the silicon nitride circuit board and the degree of crack growth of the silicon nitride substrate are set within a specific range, so that the silicon nitride circuit board is obtained in which the fracture or peeling off caused by the crack growth can be prevented and poor bonding strength or poor thermal resistance as the electronic component module can be reduced.

As will be understood from the results of Examples described below, in a case in which the heat shock parameter HS1 represented by Equation (1) and the heat shock parameter HS2 represented by Equation (2) are set to be equal to or less than 1.80 GPa, the silicon nitride circuit board capable of improving reliability and yield can be obtained in particular.

The fracture toughness value Kc of the silicon nitride substrate 10 can be measured by an IF method based on JIS R 1607. That is, a Vickers indenter is pressed to the surface of the silicon nitride substrate at 2 kgf, and the fracture toughness value of the silicon nitride substrate is evaluated from a length of a diagonal line of the Vickers indentation and a length of the crack extending from each end portion.

The coefficients of linear expansion ($\alpha_B$, $\alpha_C$, $\alpha_A$) of the silicon nitride substrate 10, the second copper layer 20, and the first copper layer 30 can be obtained by using a thermomechanical analyzer (TMA) based on JIS R 1618. In the present invention, the coefficients of linear expansion ($\alpha_B$, $\alpha_C$, $\alpha_A$) indicate the coefficients of linear expansion (linear expansion coefficient) of the copper plates and the silicon nitride substrates at 25° C. to 400° C.

The Young's modulus ($E_B$) of the silicon nitride substrate 10 can be measured by a static deflection method based on JIS R 1602.

Each configuration of the silicon nitride circuit board according to the present embodiment will be described below in more detail.

<Silicon Nitride Substrate>

The silicon nitride substrate 10 according to the present embodiment has a function of supporting the first copper layer 30 and the second copper layer 20. Here, the silicon nitride substrate 10 is rectangular when seen in the thickness direction thereof. The thickness of the silicon nitride substrate 10 is set in the range of equal to or more than 0.2 mm and equal to or less than 1.5 mm, and is 0.32 mm in the present embodiment. The shape and the like of the silicon nitride substrate 10 are examples in the present embodiment, and may be different from the case in the present embodiment as long as the function according to the present invention is exhibited.

As described above, the fracture toughness value Kc of the silicon nitride substrate 10 according to the present embodiment is equal to or more than 5.0 MPa·m$^{0.5}$ and equal to or less than 10.0 MPa·m$^{0.5}$, and more preferably equal to or more than 5.5 MPa·m$^{0.5}$ and equal to or less than 9.0 MPa·m$^{0.5}$.

Further, the Young's modulus $E_B$ of the silicon nitride substrate 10 according to the present embodiment is preferably equal to or more than 250 GPa and equal to or less than 320 GPa, and more preferably equal to or more than 250 GPa and less than 300 GPa.

Further, the coefficient of linear expansion $\alpha_B$ of the silicon nitride substrate 10 according to the present embodiment is preferably equal to or more than $1.5 \times 10^{-6}$/° C. and equal to or less than $4.0 \times 10^{-6}$/° C., and more preferably equal to or more than $1.5 \times 10^{-6}$/° C. and less than $2.5 \times 10^{-6}$/° C.

By adjusting the physical properties of the silicon nitride substrate 10 in the above manner, the heat shock parameters HS1 and HS2 can be easily adjusted within the above numerical ranges, and thus poor bonding strength or poor thermal resistance can be further reduced.

The silicon nitride substrate 10 can be manufactured by a known method, and the fracture toughness value Kc, Young's modulus $E_B$, and the coefficient of linear expansion $\alpha_B$ of the silicon nitride substrate 10 can be adjusted by controlling the manufacturing method of the silicon nitride substrate 10, specifically, the blending of the raw materials, the baking conditions (rate of temperature rise, holding temperature, holding time, cooling rate, and the like) and the like. A manufacturing method of the silicon nitride substrate 10 is as described below.

<First Copper Layer and Second Copper Layer>

The first copper layer 30 and the second copper layer 20 are polygonal when seen in the thickness direction thereof. The thicknesses of the first copper layer 30 and the second copper layer 20 are set in the range of equal to or more than 0.5 mm and equal to or less than 2.0 mm, and are more preferably equal to or more than 0.8 mm and equal to or less than 1.2 mm. In the present embodiment, thicknesses thereof are set to 0.8 mm as an example. The shapes and the like of the first copper layer 30 and the second copper layer 20 are examples in the present embodiment, and may be different from the case in the present embodiment as long as the function according to the present invention is exhibited.

The coefficients of linear expansion of the first copper layer 30 and the second copper layer 20 according to the present embodiment change depending on the type of copper, but does not change significantly, and thus in the present embodiment, the coefficient of linear expansion of the copper layer is $17.3 \times 10^{-6}$ (/° C.).

By adjusting the physical properties of the first copper layer 30 and the second copper layer 20 in the above manner, the heat shock parameters HS1 and HS2 can be easily adjusted within the above numerical ranges, and thus poor bonding strength or poor thermal resistance can be further reduced.

An average crystal grain size of copper crystals in the first copper layer 30 is preferably equal to or more than 50 μm and equal to or less than 500 μm, and more preferably equal to or more than 100 μm and equal to or less than 300 μm.

In a case in which the silicon nitride circuit board according to the present embodiment is used as the electronic component module as described below, the electronic component 40 is mounted over the first copper layer 30 through a bonding layer such as a solder layer 31, the first copper layer 30 is interposed between the solder layer and the silicon nitride substrate 10, and the thermal stress generated by a difference in the coefficient of thermal expansion from these materials is applied thereto, but by setting the average crystal grain size of the copper crystals in the first copper layer 30 within the above numerical range, poor bonding strength or poor thermal resistance can be further reduced. Although the above mechanism is not clear, it is presumed that by setting the average crystal grain size of the copper crystals in the first copper layer 30 within the above numerical range, grain boundary sliding appropriately occurs in the copper crystals in the first copper layer 30 and the stress is appropriately relaxed.

An average crystal grain size of copper crystals in the second copper layer 20 is preferably equal to or more than 50 μm and equal to or less than 500 μm, and more preferably equal to or more than 100 μm and equal to or less than 300 μm.

In a case in which the silicon nitride circuit board according to the present embodiment is used as the electronic component module as described below, a heat sink is bonded to the second copper layer 20 through a bonding layer such as a solder layer, the second copper layer 20 is interposed between the solder layer and the heat sink, and the silicon nitride substrate 10, and the thermal stress generated by a difference in the coefficient of thermal expansion from these materials is applied thereto, but by setting the average crystal grain size of the copper crystals in the second copper layer 20 within the above numerical range, poor bonding strength or poor thermal resistance can be further reduced. Although the above mechanism is not clear, it is presumed that by setting the average crystal grain size of the copper crystals in the second copper layer 20 within the above numerical range, grain boundary sliding appropriately occurs in the copper crystals in the second copper layer 20 and the stress is appropriately relaxed.

The average crystal grain sizes of the first copper layer 30 and the second copper layer 20 can be adjusted by controlling the type of constituent copper plate of the copper layer, the manufacturing conditions of the silicon nitride circuit board, and the like.

Further, the average crystal grain sizes of the copper crystals in the first copper layer 30 and the second copper layer 20 can be obtained by the method described in Examples.

<Brazing Material Layer>

The brazing material layer 12 and the brazing material layer 13 according to the present embodiment are disposed between the silicon nitride substrate 10 and the first copper layer 30, and between the silicon nitride substrate 10 and the second copper layer 20, respectively, and bond the first copper layer 30 or the second copper layer 20 to the silicon nitride substrate 10. The thicknesses of the brazing material layer 12 and the brazing material layer 13 are typically set in the range of equal to or more than 3 μm and equal to or less than 40 μm, and are more preferably equal to or more than 4 μm and equal to or less than 25 μm.

The silicon nitride circuit board according to the present embodiment may include a plating layer on the first copper layer 30 and the second copper layer 20. The plating layer can be made of a known material, and can be, for example, Ag or Ni—P.

The composition of the brazing material layer 12 and the brazing material layer 13 can be configured of a silver-copper based brazing material containing at least one active metal selected from titanium, zirconium, hafnium, niobium, tantalum, vanadium, aluminum, and tin in the brazing material. The blending ratio of Ag, Cu, and Sn or In is preferably a ratio of Ag of equal to or more than 85.0 parts by mass and equal to or less than 95.0 parts by mass, Cu of equal to or more than 5.0 parts by mass and equal to or less than 13.0 parts by mass, Sn or In of equal to or more than 0.4 parts by mass and equal to or less than 3.5 parts by mass. By setting the ratio within the above numerical range, the melting temperature of the brazing material can be prevented from rising excessively, bonding at an appropriate temperature is enabled, the thermal stress derived from the difference in the coefficient of thermal expansion at the time of bonding can be reduced, and thus the thermal resistance cycle property can be improved.

An addition amount of the active metal such as titanium can be, for example, equal to or more than 1.5 parts by mass and equal to or less than 5.0 parts by mass with respect to 100 parts by mass in total of Ag, Cu, and Sn or In. By appropriately adjusting the addition amount of the active metal, the wettability to the ceramic plate can be further improved, and the occurrence of bonding defects can be further suppressed.

Figure 3:
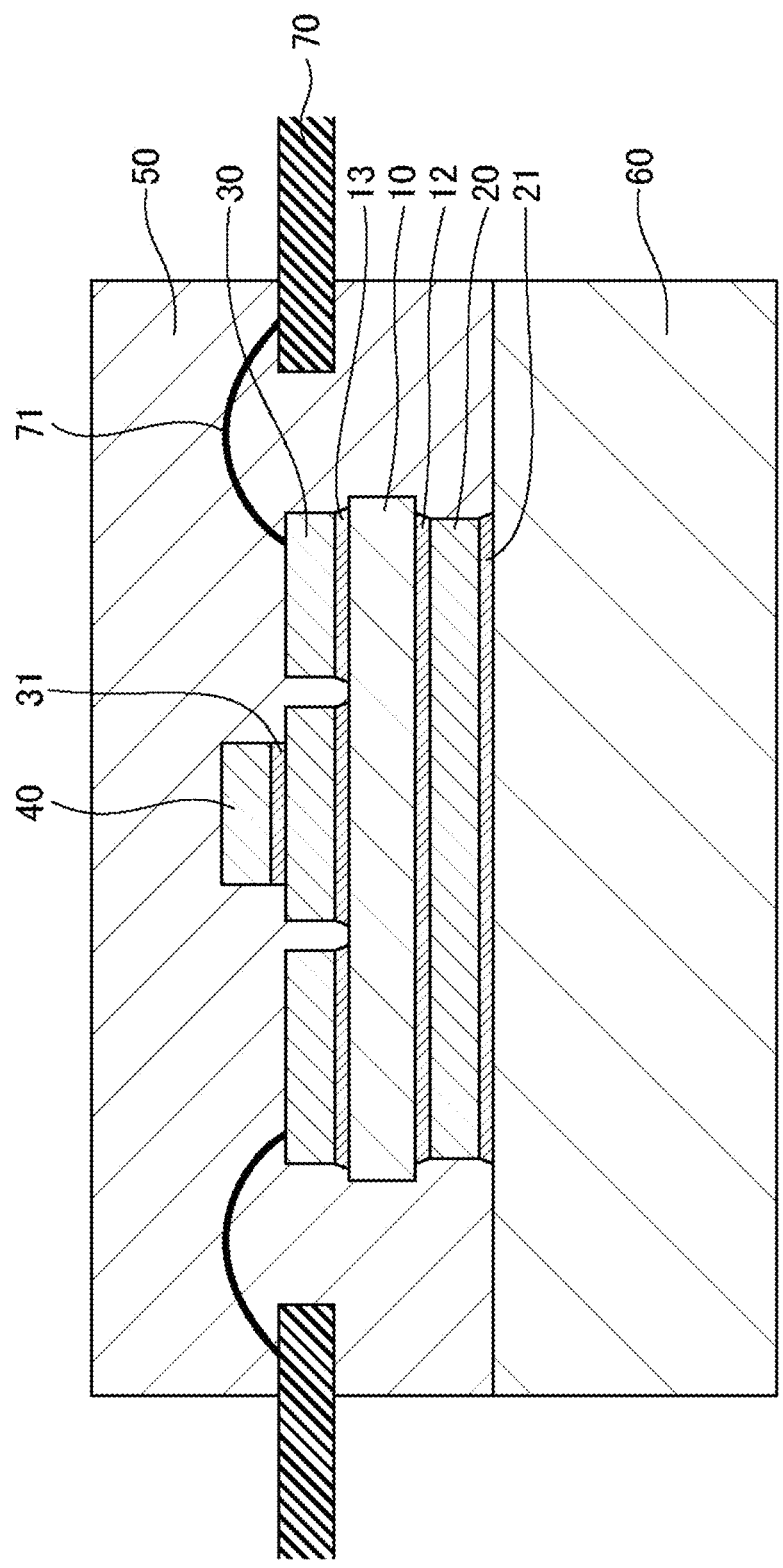
FIG. 3 is a cross-sectional view of an electronic component module according to the present embodiment.
Figure 4:
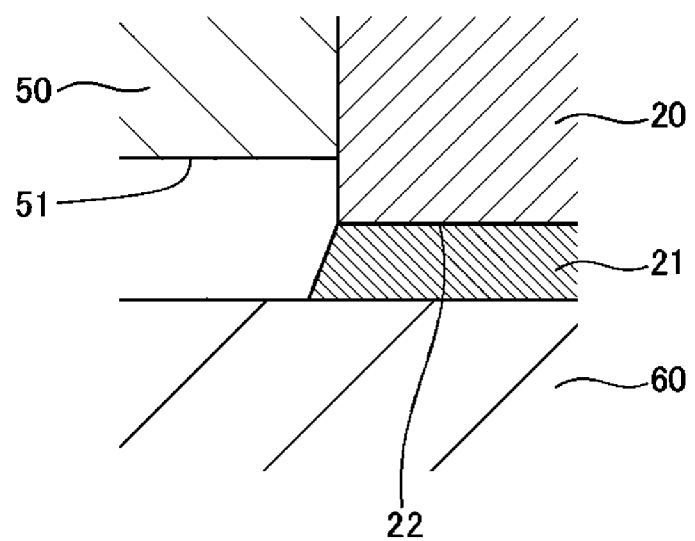
FIG. 4 is an expanded cross-sectional view of a part of the electronic component module according to the present embodiment.

Subsequently, an embodiment of the silicon nitride circuit board according to the present embodiment will be further described with reference to FIGS. 3 to 4. FIG. 3 is a cross-sectional view of the electronic component module according to the present embodiment. Also, FIG. 4 is an expanded cross-sectional view of a part of the electronic component module according to the present embodiment.

As described above, the silicon nitride circuit board 100 according to the present embodiment includes the silicon nitride substrate 10, the first copper layer 30 provided over one surface of the silicon nitride substrate 10, and the second copper layer 20 provided over the other surface of the silicon nitride substrate 10, and is used in a form sealed by a sealing resin portion 50 as shown in FIG. 3.

In addition, in the present embodiment, the surface of the second copper layer 20 opposite to the surface over which the silicon nitride substrate 10 is provided has an uncovered region that is not covered with the sealing resin portion 50.

In the present embodiment, the silicon nitride circuit board can have a form in which the surface of the second copper layer 20 opposite to the surface over which the silicon nitride substrate 10 is provided is bonded to the heat sink directly or through the bonding material layer, and in an example of the present embodiment shown in FIG. 3, the second copper layer 20 is bonded to a heat sink 60 through the bonding material layer 21.

That is, in the present embodiment, the second copper layer 20 is bonded to the heat sink 60 through the bonding material layer 21, and the surface of the second copper layer 20 facing the heat sink 60 has the uncovered region that is not covered with the sealing resin portion 50.

According to the present embodiment, even in a case in which the silicon nitride circuit board is used in a form of having a portion covered with the sealing resin portion 50 having different coefficient of linear expansion and the uncovered region that is not covered, or even in a case in which the silicon nitride circuit board is used in a form in which the second copper layer 20 is further bonded to the heat sink 60 having different coefficient of linear expansion, by adjusting the heat shock parameters HS1 and HS2, and the fracture toughness value of the silicon nitride substrate 10, poor bonding strength or poor thermal resistance can be reduced.

In the present embodiment, the first copper layer 30 is the copper layer formed in the circuit pattern. The electronic component 40 is bonded to the first copper layer 30 through the solder layer 31, and the first copper layer 30 or the electronic component 40 is connected to an external connection terminal 70 by a lead frame or a wire bonding 71 for external connection. In the present embodiment, as an example, an example in which the wire bonding 71 is connected to the external connection terminal 70 is described. Also, the external connection terminal 70 can be directly connected to the substrate without using the wire bonding 71. In this case, the external connection terminal 70 can be bonded thereto by, for example, soldering or ultrasonic bonding.

The electronic component 40 is an electronic component such as a semiconductor element, and various semiconductor elements such as an insulated gate bipolar transistor (IGBT), a metal oxide semiconductor field effect transistor (MOSFET), and a free wheeling diode (FWD) can be selected depending on a desired function.

The solder layer 31 that bonds the electronic component 40 can be formed of, for example, a Sn—Sb-based, Sn—Ag-based, Sn—Cu-based, Sn—In-based, or Sn—Ag—Cu-based solder material (so-called lead-free solder material).

Also, the external connection terminal 70 is formed of, for example, copper or a copper alloy, and the wire bonding 71 is formed of, for example, copper, a copper alloy, aluminum, gold, or the like.

The sealing resin portion 50 can be formed by hardening a resin composition for forming the sealing resin portion.

The type of the resin composition for forming the sealing resin portion is not particularly limited, and a resin composition usually used in the technical field such as a resin composition for transfer molding, a resin composition for compression molding, and a liquid sealing material can be used.

The resin composition for forming the sealing resin portion preferably contains a thermosetting resin, more preferably contains one or two or more selected from an epoxy resin, a phenol resin, a cyanate resin, a bismaleimide triazine resin, an acrylic resin, and a silicon resin, and still more preferably contains at least an epoxy resin.

The resin composition for forming the sealing resin portion may further contain a hardening agent, a filler, and the like.

Examples of the filler include a powder of molten silica (spherical silica), crystalline silica, alumina, silicon carbide, silicon nitride, aluminum nitride, boron nitride, beryllia, zirconia, or spherical beads thereof, a glass fiber, an aramid fiber, and a carbon fiber. One type of the filler may be used alone or two or more types thereof may be used in combination. As the resin composition for forming the sealing resin portion, for example, an epoxy-based resin with a $SiO_2$ filler can be used.

Further, in the present embodiment, the second copper layer 20 is a copper layer for bonding to a heat sink.

In the present embodiment, the second copper layer 20 is bonded to the heat sink 60 through the bonding material layer 21.

For example, the heat sink 60 is formed of a material having a high thermal conductivity such as aluminum, copper, or an alloy thereof, and is preferably formed of aluminum or an aluminum alloy.

The electronic component module according to the present embodiment includes the silicon nitride circuit board described above. That is, the electronic component module according to the present embodiment includes the silicon nitride circuit board, the electronic component 40 mounted over the silicon nitride circuit board, and the sealing resin portion 50 that seals the silicon nitride circuit board 100 and the electronic component 40.

Further, in the electronic component module according to the present embodiment, the surface of the second copper layer 20 opposite to the surface over which the silicon nitride substrate 10 is provided protrudes from the sealing resin portion 50 in a direction away from the silicon nitride substrate 10. That is, as shown in FIG. 4, in a case in which the surface of the sealing resin portion 50 facing the heat sink 60 is defined as a lower surface 51 of the sealing resin portion, and the surface of the second copper layer 20 facing the heat sink 60 is defined as a lower surface 22 of the second copper layer, there is a step between the lower surface 51 of the sealing resin portion and the bonding material layer 21, and the lower surface 22 of the second copper layer is designed to protrude from the lower surface 51 of the sealing resin portion. By designing in this way, in a step of bonding the silicon nitride circuit board 100 to the heat sink 60, that is, in a step of bonding the lower surface 22 of the second copper layer (uncovered region that is not covered with the sealing resin portion 50) to the heat sink 60, when the silicon nitride circuit board 100 and the heat sink 60 are pressed and brought contact with each other, the lower surface 22 of the second copper layer is firstly in contact with the heat sink 60, so that the lower surface 22 of the second copper layer can be bonded to the heat sink 60 smoothly without the sealing resin portion 50 interfering with the bonding, and the reliability of bonding the second copper layer 20 and the heat sink 60 can be improved.

<Manufacturing Method of Silicon Nitride Circuit Board>

The silicon nitride circuit board according to the present embodiment can be manufactured by a method as follows.

First, the silicon nitride substrate 10 having a desired physical property is prepared. The silicon nitride substrate 10 can be obtained by the manufacturing method below. That is, a raw material powder containing a silicon nitride powder, a sintering aid such as $Y_2O_3$, and MgO, an organic solvent, an organic binder if necessary, a plasticizer, and the like are uniformly mixed with a ball mill to obtain a raw material slurry. After being defoamed and thickened, the obtained raw material slurry is molded into a sheet by a doctor blade method to obtain a molded body. After cutting the obtained sheet molded body, the sheet molded body is degreased at 400° C. to 800° C., and further baked in a baking furnace at 1700° C. to 1900° C. for 1 to 10 hours in a nitrogen atmosphere to obtain the silicon nitride substrate 10.

Here, the fracture toughness value Kc, Young's modulus $E_B$, and the coefficient of linear expansion $\alpha_B$ of the silicon nitride substrate 10 can be adjusted by controlling the manufacturing method of the silicon nitride substrate 10, specifically, the manufacturing conditions such as the blending of the raw materials, the baking conditions, and the like. Although it depends on the blending of the raw materials and the balance with other manufacturing conditions, the fracture toughness value Kc can be controlled by adjusting, for example, the baking conditions (rate of temperature rise, holding temperature, holding time, cooling rate, and the like), and as an example, the fracture toughness value Kc increases as the baking temperature increases, and the fracture toughness value Kc decreases as the baking temperature decreases. Further, the Young's modulus $E_B$ can be controlled by, for example, adjusting the baking conditions (rate of temperature rise, holding temperature, holding time, cooling rate, and the like), and as an example, the Young's modulus $E_B$ decreases as the baking temperature increases, and the Young's modulus $E_B$ increases as the baking temperature decreases. Further, although it depends on the balance with other manufacturing conditions, the coefficient of linear expansion $\alpha_B$ becomes small as the addition amount of the sintering aid increases, and becomes large as the addition amount of the sintering aid decreases.

Next, as the brazing material containing the active metal, for example, an Ag—Cu based alloy paste to which the active metal Ti is added is printed and formed on both surfaces of the silicon nitride substrate 10, and the copper plate having a rectangular shape substantially the same as the silicon nitride substrate 10 is heated and bonded to both surfaces thereof at a temperature of 600° C. to 900° C. Here, as the copper plate, an oxygen-free copper plate is preferably used, and a rolled copper plate is more preferably used. The silicon nitride-copper composite can be obtained by bonding the copper plates to both surfaces of the silicon nitride substrate 10 through the brazing material.

Subsequently, the first copper layer 30 is etched to form the circuit pattern. A photoresist (not shown in the drawings) is laminated on the upper surface of the first copper layer 30. In this case, a liquid photoresist may be applied.

Next, in order to form the circuit pattern on the photoresist, a pattern in accordance with the circuit pattern is exposed. In this case, the photoresist may be exposed by bring the film on which a negative image of the circuit pattern is formed into close contact with the photoresist by so-called batch exposure, or the photoresist may be exposed by using a so-called direct drawing type exposure device (without using the film).

Then, the exposed photoresist is etched in accordance with the circuit pattern.

Thereafter, the remaining photoresist is removed.

In this case, the second copper layer 20 may not be etched, or the pattern may be formed in the same manner. Further, the second copper layer 20 and the first copper layer 30 after forming the circuit pattern can be subjected to plating.

As described above, the silicon nitride circuit board 100 in a state in which the circuit pattern is formed is manufactured.

Next, the electronic component 40 is mounted over the first copper layer 30 through the solder layer 31. In the present embodiment, the first copper layer 30 and the electronic component 40 are solder-bonded by using, for example, a Sn—Sb-based, Sn—Ag-based, Sn—In-based, or Sn—Ag—Cu-based solder material.

Next, the electronic component module is sealed with a resin by using a sealing resin to form the sealing resin portion 50. A known method can be used for sealing with a resin, and for example, sealing with a resin can be performed by transfer molding. Further, in a resin-sealing step, for example, sealing with a resin is performed in a state in which the lower surface 22 of the second copper layer of the electronic component module is pressed to the plastic material in advance, so that the uncovered region that is not covered with the sealing resin portion 50 can remain on the surface of the second copper layer 20 opposite to the surface over which the silicon nitride substrate 10 is provided, that is, the lower surface 22 of the second copper layer and the lower surface 22 of the second copper layer can protrude from the lower surface 51 of the sealing resin portion.

In the above described manner, the electronic component module is manufactured.

The present invention is not limited to the embodiments described above, and modifications, improvements, and the like within the scope in which the object of the present invention can be achieved are included in the present invention.

Examples

The present invention will be described below in detail with reference to Examples, but the present invention is not limited to the description of these Examples.

A plurality of silicon nitride circuit boards having different HS1, HS2, and fracture toughness values $K_c$ were prepared by a method as follows, and a heat cycle test described below was performed.

<Silicon Nitride Substrate>

Silicon nitride substrates B-1 to B-10 (148 mm×200 mm×0.32 mm) having various coefficients of linear expansion $\alpha_B$, Young's moduli $E_B$, and fracture toughness values $K_c$ were prepared by adjusting the blending of the raw materials and the baking conditions.

<Copper Plate for First Copper Layer and Second Copper Layer>

A rolled copper plate of which the coefficient of linear expansion is $17.3\times10^{-6}/°$ C. and a thickness is 0.8 mm was prepared.

<Manufacturing Method of Silicon Nitride Circuit Board>

Silicon nitride circuit boards 1 to 10 were manufactured by using the silicon nitride substrates and the copper plates of a combinations shown in Table 1.

First, as the brazing material (including active metal), a brazing material containing 3.5 parts by mass of titanium hydride powders (manufactured by Toho Technical Service Co., Ltd.: TCH-100) with respect to a total of 100 parts by mass of 89.5 parts by mass of Ag powders (manufactured by Fukuda Metal Foil & Powder Co., Ltd.: Ag-HWQ 2.5 μm), 9.5 parts by mass of Cu powders (manufactured by Fukuda Metal Foil & Powder Co., Ltd.: Cu-HWQ 3 μm), and 1.0 part by mass of Sn powders (manufactured by Fukuda Metal Foil & Powder Co., Ltd.: Sn-HPN 3 μm) was prepared.

The brazing material described above, a binder resin, and the solvent were mixed to obtain a brazing material paste. The brazing material paste was applied to both surfaces of the silicon nitride substrate by a screen printing method such that a dry thickness on each surface was about 10 μm.

Thereafter, the copper plates were laminated over both surfaces of the silicon nitride substrate and heated in a vacuum of equal to or less than $1.0\times10^{-3}$ Pa at 780° C. for 30 minutes to bond the silicon nitride substrate to the copper plate with the brazing material. As a result, the silicon nitride-copper composite in which the silicon nitride substrate and the copper plates were bonded with the brazing material was obtained. Further, an etching resist was printed on the obtained silicon nitride-copper composite copper layer and etched with a ferric chloride solution to form the circuit pattern to obtain the silicon nitride circuit board.

When the average crystal grain size of copper was evaluated for the silicon nitride circuit board 1 by a method as follows, the average crystal grain size of the copper crystals in the first copper layer was 250 μm, and the average crystal grain size of the copper crystals in the second copper layer was 255 μm.

<Evaluation Method of Copper Plate and Silicon Nitride Substrate>

(1) Coefficient of Linear Expansion ($\alpha_B$) of Copper Plate and Silicon Nitride Substrate Based on JIS R 1618, the coefficient of linear expansion (linear expansion coefficient) of each copper plate and each silicon nitride substrate at 25° C. to 400° C. was measured by using the thermomechanical analyzer (TMA).

(2) Young's Modulus ($E_B$) of Silicon Nitride Substrate

The Young's modulus was measured by the static deflection method based on JIS R1602. A shape of a test piece was 3 mm×4 mm×40 mm.

(3) Fracture toughness value ($K_c$) of Silicon Nitride Substrate

The fracture toughness value was measured by the IF method based on JIS R 1607. That is, the Vickers indenter was pressed to the surface of the silicon nitride substrate at 2 kgf, and the fracture toughness value of the silicon nitride substrate was evaluated from the length of the diagonal line of the Vickers indentation and the length of the crack extending from each end portion.

<Evaluation Method of Average Crystal Grain Size of Copper>

The average crystal grain sizes of copper in the first copper layer and the second copper layer in the silicon nitride circuit board were obtained by a method as follows.

First, a "cross section" for measurement was obtained by a procedure as follows.

(1) The ceramic circuit boards obtained in each Example and Comparative Example were cut with a cross section perpendicular to a main surface and passing through the center of gravity of the board. A contour machine was used for cutting.

(2) The cut silicon nitride circuit board was embedded in a resin to prepare a resin embedding body.

(3) A cross section of the complex in the prepared resin embedding body was buff-polished with diamond abrasive grains.

The cross section of the silicon nitride circuit board polished above was measured by an electron backscatter diffraction method.

Specifically, first, data was acquired by performing analysis by the electron backscatter diffraction (EBSD) in the observation field of 50 times under the condition of an acceleration voltage of 15 kV near the center of the first copper layer or the second copper layer polished above. In the EBSD method, a SU6600 type field emission scanning electron microscope manufactured by Hitachi High-Tech Corporation and an analyzer manufactured by TSL Solutions Co., Ltd. were used.

The measurement data was visualized by software: OIM Data Analysis 7.3.0 manufactured by TSL Solutions Co., Ltd. to prepare a crystal orientation map. The average crystal grain size of the copper crystals in the copper layer was obtained by analyzing this crystal orientation map with image processing software.

In the above, as the image processing software, Image-Pro Plus Shape Stack version 6.3 manufactured by Media Cybernetics, Inc. was used. For calculation of the average crystal grain size, an intercept method was used, ten or more straight lines of a predetermined length were drawn in parallel on one observation image, and the average value of the lengths of the straight lines of the portion in which the copper crystal particles are crossed by the straight lines was obtained as the average crystal grain size of the copper crystals (this processing was automatically performed by the software to calculate the values).

<Thermal Cycle Test and Reliability Evaluation>

First, a bonding substrate to be tested at room temperature (for example, 20° C.) was moved to an environment of 150° C. and held in an environment of 150° C. for 15 minutes (first step).

Next, the bonding substrate was moved from the environment of 150° C. to an environment of −55° C. and held in the environment of −55° C. for 15 minutes (second step).

Then, the first step and the second step were alternately repeated 2000 times.

Next, the presence or absence of peeling off of the copper layer was observed by ultrasonic flaw detection measurement.

The criteria for evaluation are shown below.

A: No peeling off occurred.

B: Peeling off occurred slightly.

Specifically, the silicon nitride circuit board 2 in which peeling off occurred was used as a reference, and a case in which the occurrence of peeling off was observed and the degree thereof is about the same as that of the silicon nitride circuit board 2, or a case in which the occurrence of peeling off was observed, but the degree thereof is less than that of the silicon nitride circuit board 2 was defined as B.

C: peeling off occurred largely.

Specifically, the silicon nitride circuit board 2 in which peeling off occurred was used as a reference, and a case in which the occurrence of peeling off was observed and the peeling off occurred more than the silicon nitride circuit board 2 was defined as C.

The evaluation results are summarized in Table 1.

TABLE 1

| | First copper layer | Silicon nitride substrate | | | Second copper layer | | | | |
| --- | --- | --- | --- | --- | --- | --- | --- | --- | --- |
| | Coefficient of linear expansion $\alpha A/°$ C. | Sample name | Coefficient of linear expansion $\alpha B/°$ C. | Young's modulus EB GPa | Fracture toughness value Kc MPa·m$^{0.5}$ | Coefficient of linear expansion $\alpha C /°$ C. | Heat shock parameter HS1 GPa | Heat shock parameter HS2 GPa | Reliability evaluation | |
| Silicon nitride circuit board 1 | $17.3 \times 10^{-6}$ | B-1 | $1.5 \times 10^{-6}$ | 250 | 6.8 | $17.3 \times 10^{-6}$ | 1.69 | 1.69 | A | Example 1 |
| Silicon nitride circuit board 2 | $17.3 \times 10^{-6}$ | B-2 | $4.0 \times 10^{-6}$ | 320 | 6.0 | $17.3 \times 10^{-6}$ | 1.82 | 1.82 | B | Example 2 |
| Silicon nitride circuit board 3 | $17.3 \times 10^{-6}$ | B-3 | $1.5 \times 10^{-6}$ | 320 | 5.8 | $17.3 \times 10^{-6}$ | 2.16 | 2.16 | B | Example 3 |
| Silicon nitride circuit board 4 | $17.3 \times 10^{-6}$ | B-4 | $4.0 \times 10^{-6}$ | 250 | 7.2 | $17.3 \times 10^{-6}$ | 1.42 | 1.42 | A | Example 4 |
| Silicon nitride circuit board 5 | $17.3 \times 10^{-6}$ | B-5 | $2.6 \times 10^{-6}$ | 250 | 7.0 | $17.3 \times 10^{-6}$ | 1.57 | 1.57 | A | Example 5 |
| Silicon nitride circuit board 6 | $17.3 \times 10^{-6}$ | B-6 | $2.6 \times 10^{-6}$ | 320 | 5.9 | $17.3 \times 10^{-6}$ | 2.01 | 2.01 | B | Example 6 |
| Silicon nitride circuit board 7 | $17.3 \times 10^{-6}$ | B-7 | $2.4 \times 10^{-6}$ | 250 | 6.8 | $17.3 \times 10^{-6}$ | 1.59 | 1.59 | A | Example 7 |
| Silicon nitride circuit board 8 | $17.3 \times 10^{-6}$ | B-8 | $2.4 \times 10^{-6}$ | 320 | 5.7 | $17.3 \times 10^{-6}$ | 2.04 | 2.04 | B | Example 8 |
| Silicon nitride circuit board 9 | $17.3 \times 10^{-6}$ | B-9 | $1.5 \times 10^{-6}$ | 300 | 4.8 | $17.3 \times 10^{-6}$ | 2.03 | 2.03 | C | Comparative Example 1 |
| Silicon nitride circuit board 10 | $17.3 \times 10^{-6}$ | B-10 | $1.3 \times 10^{-6}$ | 340 | 5.5 | $17.3 \times 10^{-6}$ | 2.33 | 2.33 | C | Comparative Example 2 |

As shown in Table 1, in the silicon nitride circuit boards according to Examples of which the fracture toughness value and HS1 and HS2 were within the range defined in the present invention, peeling off occurred slightly, and particularly in the silicon nitride circuit boards according to Examples of which HS1 and HS2 were equal to or less than 1.80 GPa, no peeling off occurred.

From the above results, it is understood that it is important to select the constituent material of the copper layer and the material of the silicon nitride substrate in order to stably obtain the silicon nitride circuit board having high reliability.

This application claims priority based on Japanese Patent Application No. 2019-066151 filed on Mar. 29, 2019, the entire disclosure of which is incorporated herein by reference.

REFERENCE SIGNS LIST

10: silicon nitride substrate
12: brazing material layer
13: brazing material layer
20: second copper layer
21: bonding material layer
22: lower surface of second copper layer
30: first copper layer
31: solder layer
40: electronic component
50: sealing resin portion
51: lower surface of sealing resin portion
60: heat sink
70: external connection terminal
71: wire bonding
100: silicon nitride circuit board

The invention claimed is:

1. A silicon nitride circuit board comprising:
a silicon nitride substrate;
a first copper layer provided over one surface of the silicon nitride substrate; and
a second copper layer provided over the other surface of the silicon nitride substrate,
wherein:
a fracture toughness value Kc of the silicon nitride substrate is equal to or more than 5.0 MPa·m$^{0.5}$ and equal to or less than 10.0 MPa·m$^{0.5}$,
in a case in which a coefficient of linear expansion of the silicon nitride substrate is defined as $\alpha_B$ (/° C.), a Young's modulus of the silicon nitride substrate is defined as $E_B$ (GPa), a coefficient of linear expansion of the first copper layer is $\alpha_A$ (/° C.), and a coefficient of linear expansion of the second copper layer is defined as $\alpha_C$ (/° C.), each of a heat shock parameter HS1 represented by Equation (1) and a heat shock parameter HS2 represented by Equation (2) is equal to or more than 1.30 GPa and equal to or less than 2.30 1.80 GPa, wherein $$HS1=(\alpha_A-\alpha_B)\times E_B\times(350-(-78)) \quad \text{Equation (1)}$$

$$HS2=(\alpha_C-\alpha_B)\times E_B\times(350-(-78)), \text{ and} \quad \text{Equation (2)}$$

the coefficient of linear expansion $\alpha_B$ of the silicon nitride substrate is equal to or more than 1.5×10$^{-6}$/° C. and less than 2.5×10$^{-6}$/° C.

2. The silicon nitride circuit board according to claim 1, wherein an average crystal grain size of copper crystals in the first copper layer is equal to or more than 50 μm and equal to or less than 500 μm.

3. The silicon nitride circuit board according to claim 1, wherein an average crystal grain size of copper crystals in the second copper layer is equal to or more than 50 μm and equal to or less than 500 μm.

4. The silicon nitride circuit board according to claim 1, wherein the Young's modulus $E_B$ of the silicon nitride substrate is equal to or more than 250 GPa and equal to or less than 320 GPa.

5. The silicon nitride circuit board according to claim 1, wherein the coefficient of linear expansion $\alpha_B$ of the silicon nitride substrate is equal to or more than 1.5×10$^{-6}$/° C. and equal to or less than 2.4×10$^{-6}$/° C.

6. The silicon nitride circuit board according to claim 1, wherein the silicon nitride circuit board is used in a form sealed by a sealing resin portion.

7. The silicon nitride circuit board according to claim 6, wherein the form is a form in which a surface of the second copper layer opposite to a surface over which the silicon nitride substrate is provided has an uncovered region that is not covered with the sealing resin portion.

8. The silicon nitride circuit board according to claim 6, wherein the form is a form in which a surface of the second copper layer opposite to a surface over which the silicon nitride substrate is provided is bonded to a heat sink directly or through a bonding material layer.

9. The silicon nitride circuit board according to claim 1, wherein the first copper layer is a copper layer formed in a circuit pattern.

10. The silicon nitride circuit board according to claim 1, wherein the second copper layer is a copper layer for bonding to a heat sink.

11. An electronic component module comprising:
a silicon nitride circuit board;
an electronic component mounted over the silicon nitride circuit board; and
a sealing resin portion that seals the silicon nitride circuit board and the electronic component,
wherein the silicon nitride circuit board is the silicon nitride circuit board according to claim 1.

12. The electronic component module according to claim 11,
wherein a surface of the second copper layer opposite to a surface over which the silicon nitride substrate is provided protrudes from the sealing resin portion in a direction away from the silicon nitride substrate.

* * * * *